United States Patent
Chiu et al.

(10) Patent No.: US 8,405,416 B2
(45) Date of Patent: Mar. 26, 2013

(54) PROBE AND METHOD FABRICATING THE SAME

(75) Inventors: Chun-lang Chiu, Pingzhen (TW);
Ren-tsai Hung, Taiping (TW);
Ming-kang Huang, Xinzhuang (TW);
Chih-kun Lin, Hsinchu (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 453 days.

(21) Appl. No.: 12/780,886

(22) Filed: May 15, 2010

(65) Prior Publication Data
US 2011/0210760 A1 Sep. 1, 2011

(30) Foreign Application Priority Data
Feb. 26, 2010 (TW) .............................. 99105702 A (51) Int. Cl.
*G01R 31/02* (2006.01)
(52) U.S. Cl. .............. 324/762.1; 324/750.05; 324/750.3
(58) Field of Classification Search .................. None
See application file for complete search history.

(56) References Cited

U.S. PATENT DOCUMENTS

| | | | |
|---|---|---|---|
| 6,043,164 A * | 3/2000 | Nguyen et al. | 438/736 |
| 7,682,690 B2 * | 3/2010 | Bunyan et al. | 428/323 |
| 7,755,713 B2 * | 7/2010 | Lin et al. | 349/54 |
| 7,820,233 B2 * | 10/2010 | Chen et al. | 427/97.1 |

* cited by examiner

*Primary Examiner* — Melissa Koval
*Assistant Examiner* — Trung Q. Nguyen
(74) *Attorney, Agent, or Firm* — Cheng-Ju Chiang (57) ABSTRACT

A probe includes a wire and a bump, wherein the wire is formed on a substrate; and the bump is formed upon the wire. In addition, a probe block includes a plurality of probes disposed on a substrate, so that the probe block is composed of a plurality of wires and bumps. The wires are disposed on the substrate and each bump is disposed accurately upon an end of each wire. The bump and the wire of the probe in accordance with the present invention are formed jointlessly. A method of fabricating the probe is characterized in that a grayscale mask is utilized to form the wire on the substrate and form the bump upon the wire by using a single masking process.

11 Claims, 7 Drawing Sheets

PROBE AND METHOD FABRICATING THE SAME

TECHNICAL FIELD OF THE INVENTION

The present invention relates to a probe and a method fabricating the same, and especially to a probe for testing liquid crystal display panels and a method fabricating the same.

BACKGROUND OF THE INVENTION

A probe is utilized to measure electrical characteristics of a tiny electronic component (for example, a semiconductor device or a thin film transistor array in a liquid crystal display panel). A person who is skilled in the art realizes that a thin film transistor array (TFT Array) has a plurality of gate lines and signal lines that are respectively connected to a plurality of test pads for exchanging signals with an external electronic system. Electrical signals are inputted into the TFT arrays through the aforementioned test pads to implement a testing process. Then, the testing results are outputted to the external electronic system through the aforementioned test pads to detect the performance of electrical characteristics of the display panel or detect any defect thereof.

In the mean-time, a plurality of probes are arranged on a flexible printed circuit (FPC) board to form a "Probe Block" or a "Probe Card". The probes actually contact the test pads of the circuits under test (such as the TFT array) in a testing process so that the circuits can be tested through the test pads with external components or systems.

Currently, with increasing pixels in the liquid crystal display panels, the distances between the adjacent test pads are shortened, as well as the sizes of the test pads become smaller. In order to contact easily, the structure of a probe is fabricated as a bump being coupled to one end of a lead. The bump is connected with one of the test pads of the circuits under test, so that the electrical signals of the circuits (such as the TFT array) can be outputted through the lead. In addition, due to the shortened distances between the test pads, the distances between the bumps of the probes are also shortened. Therefore, the bumps of the probes must be precisely arranged when contacting the test pads so as to avoid a short circuit or electrical disturbances generated therebetween.

Figure 1:
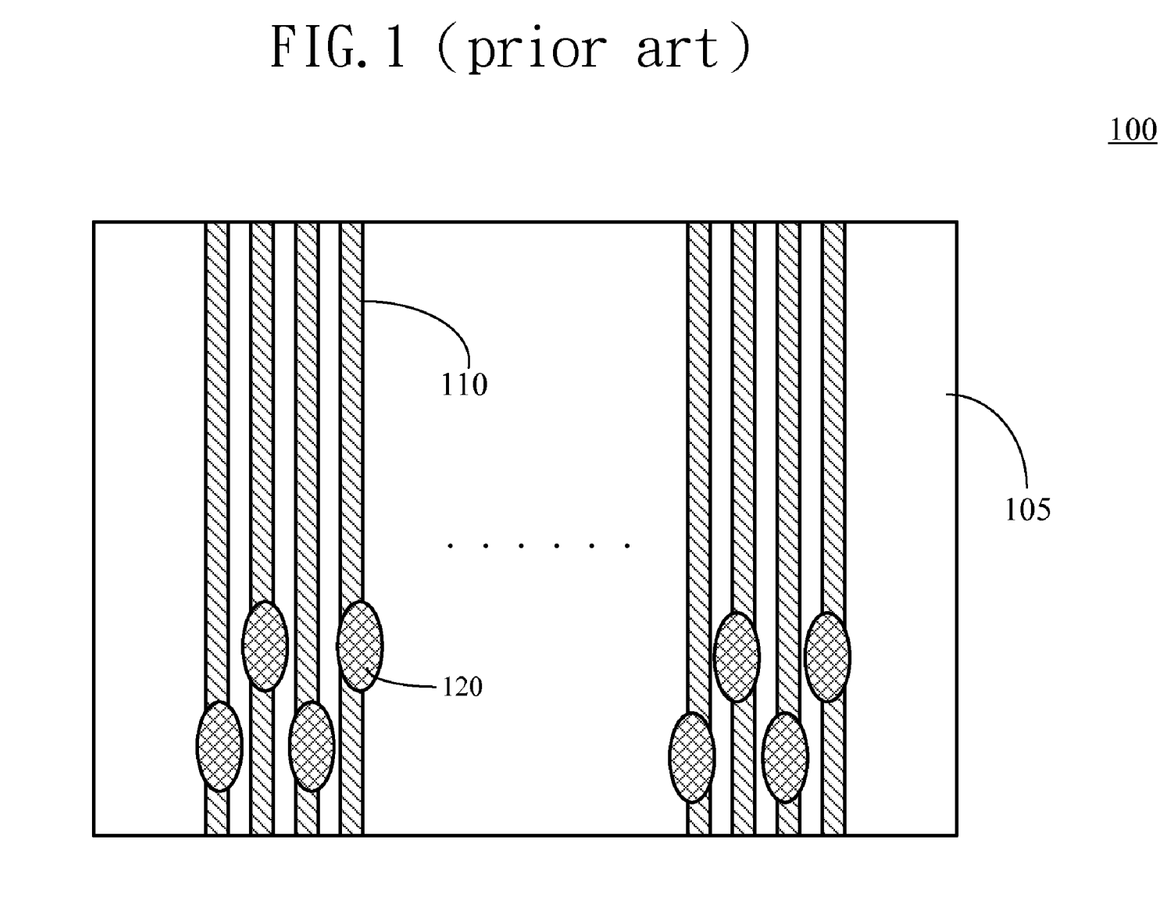
FIG. 1 is a top view illustrating a probe block fabricated by conventional art.

Please refer to FIG. 1. FIG. 1 is a top view illustrating a probe block fabricated by conventional art. FIG. 1 illustrates the structure of a probe block 100, wherein the probe block 100 includes a plurality of metal wires 110 being disposed on a flexible printed circuit board 105. A plurality of metal bumps 120 being disposed on the metal wires 110, and the metal bumps being arranged into staggered rows as shown in FIG. 1. Such an arrangement is designed to increase the distance between the adjacent metal bumps 120, but the metal bumps can also be aligned into a single row.

Because the metal bumps 120 of the probe block 100 have to be arranged closely, the conventional art utilizes a photolithography to fabricate the metal wires 110 and the metal bumps 120 on the flexible printed circuit board 105. The metal wires 110 are connected to the metal bumps 120, and the metal bumps 120 are utilized to contact the test pads. The fabrication method includes the steps as follows: forming a plurality of metal wires 110 which are disposed on a flexible printed circuit board 105 by a first photolithography process; and forming a plurality of metal bumps 120 which are disposed on the metal wires 110 by a second photolithography process.

However, in the exposure process of the second photolithography process in fabricating the metal bumps 120, the flexible printed circuit board 105 has to be aligned and fixed by the clamping apparatuses. Moreover, due to the flexible characteristic of the flexible printed circuit board 105, the flexible printed circuit board 105 is deformed after it is fixed by the clamping apparatuses. Still, the aligned position could be dislocated in the second photolithography process, and the metal bumps 120 could be inaccurately formed on the metal wires 110 thereof.

Figure 2:
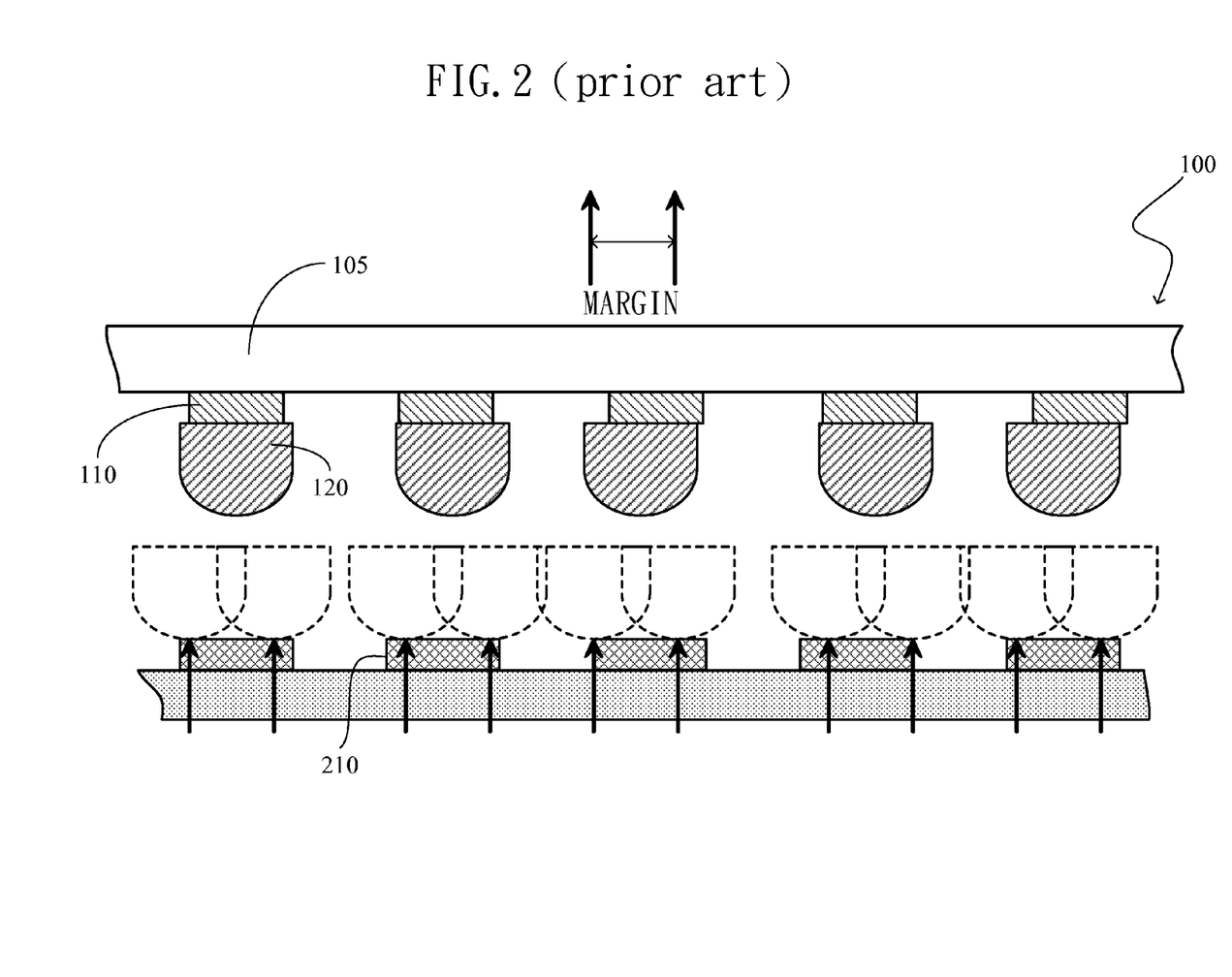
FIG. 2 is a cross-sectional view illustrating a probe block fabricated by a conventional art with contacting test pads.

Please refer to FIG. 2. FIG. 2 is a cross-sectional view illustrating a probe block fabricated by conventional art when contacting the test pads. FIG. 2 illustrates the shortcomings of testing by using the probe block 100 which is fabricated by conventional art. The dislocated distances between the metal bumps 120 and the metal wires 110 give rise to a concern that the probe block 100 must be aligned accurately to a plurality of test pads 210 when utilized in actual tests. As a result of the aforementioned, the probe block 100 is only allowed to dislocate a short distance. Moreover, the dashed lines in FIG. 2 represent the limits of the positions that each of the metal bumps 120 is correctly measured, and the limits are indicated by the arrows shown in FIG. 2. In other words, the margin is very narrow when using the conventional probe block 100 to test. In addition, when the dislocated distances of the positions are greater than the margin, the metal bumps 120 on the probe block 100 will contact the other test pads 210, thus causing detection errors.

Moreover, the metal bumps that are fabricated by conventional art can not be accurately formed on the metal wires, and there are gaps existing between the metal bumps and the metal wires. Thus, when the metal bumps contact the test pads, the metal bumps may be cracked from the gaps therein by lateral forces caused by the metal bumps being out of alignment with the test pads, and thus the probes become unserviceable. Consequently, the probes' durability can not be improved, and even worse, the aforementioned occurrence might give rise to false test results.

Therefore, fabricating accurate and durable probes to test liquid crystal display panels is urgently needed to be proposed. More importantly, a more efficient probe fabrication method is needed to be proposed in order to resolve the aforementioned issues.

SUMMARY OF THE INVENTION

For reasons of the aforementioned issues, an object of the present invention is to provide a method of fabricating a probe, especially fabricating a probe to test liquid crystal display panels by using a grayscale mask. This can reduce a mask manufacturing process, thereby reducing the production costs as well.

Another object of the present invention is to provide a probe block to test liquid crystal display panels, and to make the adjacent bumps of the probe block to have the same distances for increasing the margin of the tests, also solving the issue with durability.

To achieve the foregoing and the other objects, as embodied and broadly described herein, the present invention provides a probe fabrication method. The probe fabrication method includes: forming a metal layer on a substrate; forming a photoresist layer on the metal layer; patterning the photoresist layer by using a grayscale mask to form a patterned circuit protection layer, the patterned circuit protection layer having a bump area and a lead area, and the bump area being thicker than the lead area; and etching the patterned circuit protection layer and the metal layer so that the metal layer is formed as a probe corresponding to the patterned circuit protection layer, wherein the metal layer is etched as a metal bump and a metal wire of the probe, the metal bump corresponding to the bump area and the metal wire corresponding to the lead area.

In one preferred embodiment of the present invention, the photoresist layer is a positive type photoresist layer, and the grayscale mask includes an opaque bump region and a translucent lead region. Furthermore, the translucent lead region is a half-tone mask, and the material of the opaque bump region is an opaque metal.

The etching steps of the patterned circuit protection layer and the metal layer include the following: etching the metal layer which is uncovered by the patterned circuit protection layer; etching the patterned circuit protection layer for exposing the metal layer in the lead area, and remaining the patterned circuit protection layer in the bump area; and etching the metal layer corresponding to the lead area for a thickness that the etched metal layer is thinner than the metal bump in forming the metal wire. After the etching steps of etching the metal layer to form the metal wire, the method further includes stripping the patterned circuit protection layer in the bump area to expose the metal bump.

In accordance with the fabrication method of the present invention, the method utilizes the grayscale mask to fabricate the probe. The present invention only requires to have one mask manufacturing process so as to significantly reduce production costs, and the issue that the metal bumps can not be aligned precisely in the conventional two mask manufacturing processes is also improved.

To achieve the foregoing and the other objects, as embodied and broadly described herein, the present invention provides a probe block fabricated by the aforementioned probe fabrication method. The probe block includes: a plurality of metal wires disposed on a substrate; and a plurality of metal bumps, where each metal bump is disposed over the end of each metal wire, and each one of the metal bumps and the corresponding metal wire are formed jointlessly. Moreover, the distances between the adjacent metal bumps are the same, and the substrate is a flexible printed circuit board.

In accordance with the probe block of the present invention, when the probe block is utilized to test a liquid crystal display panel, the margin of contact between the probe block and the test pads is increased because the distances between the adjacent metal bumps are the same. That is, the issue of a narrow margin that the metal bumps and the metal wires of the probe block can not be precisely aligned in conventional art is solved. In addition, according to the present invention, since a metal bump and a metal wire can be formed in the same mask manufacturing process, so that a metal bump of the single probe must be formed on the top of the metal wire without any dislocated distances. The issue that the metal bump is cracked as caused by using two mask manufacturing processes is also solved, thereby extending the service life of the probe, and accurate tests may be accomplished.

It is to be understood that both the foregoing general description and the following detailed description of the present invention are exemplary and explanatory and are intended to provide further explanation of the invention as claimed.

DETAILED DESCRIPTION OF THE INVENTION

The present invention will now be described in detail with reference to a few preferred embodiments thereof as illustrated in the accompanying drawings. In different drawings, the same reference numbers will be used throughout the drawings to refer to the same or like parts. The probe that is fabricated by the present invention is not limited to be used in testing a liquid crystal display panel. Other applications such as the probe card for testing an integrated circuit (IC) or when the probe structures are required to be fabricated as microsizes can also be implemented. Although the description includes exemplary implementations, other implementations are possible, and changes may be made to the implementation described without departing from the spirit and scope of the invention.

FIG. 3 to FIG. 8 are side views showing the steps of fabricating a probe in accordance with one preferred embodiment of the present invention. FIG. 3 to FIG. 8 depict the processes of the probe fabrication method by using a grayscale mask in accordance with one preferred embodiment of the present invention.

Figure 3:
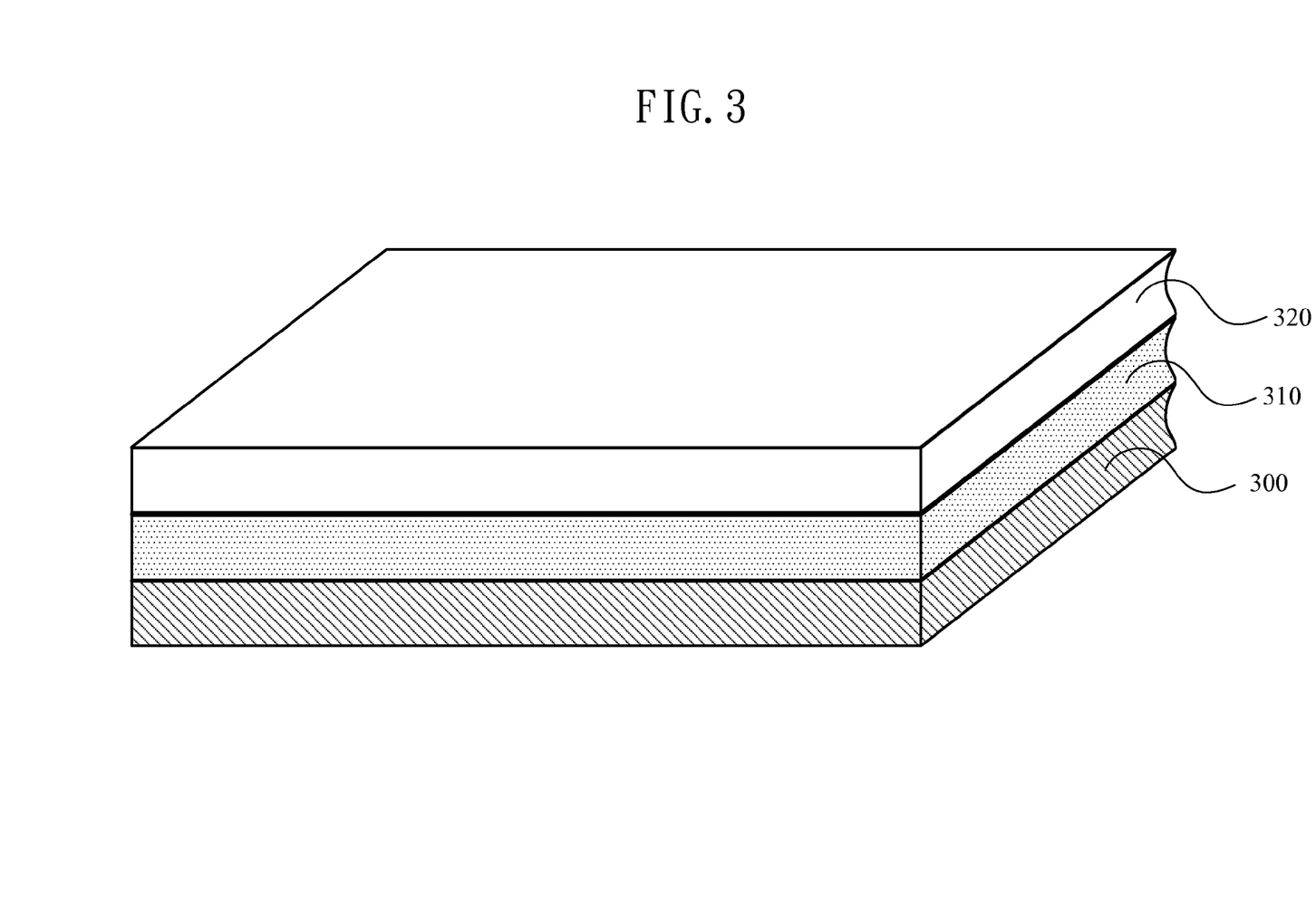
FIG. 3 is a side view illustrating a metal layer and a photoresist layer which are formed on a substrate.

FIG. 3 is a side view illustrating a metal layer and a photoresist layer being formed on a substrate. Firstly, a metal layer 310 is formed on a substrate 300 as shown in FIG. 3. Incidentally, the material of the metal layer 310 herein should be an electrical conductive metal, and the substrate 300 is a flexible printed circuit board. In addition, the method of forming the metal layer 310 to completely cover the substrate 300 is deposition, e.g. sputtering or evaporation. The metal is deposited on the substrate 300 to form the metal layer 310 with a predetermined thickness, the predetermined thickness is said to be best between 100 μm to 200 μm.

Next, a photoresist layer 320 is formed on the metal layer 310 as shown in FIG. 3. The photoresist layer 320 herein should be a positive type photoresist layer. The method of forming the photoresist layer 320 on the metal layer 310 is a coating method, where a spin coater is used to entirely coat the positive type photoresist over the metal layer 310.

Figure 4:
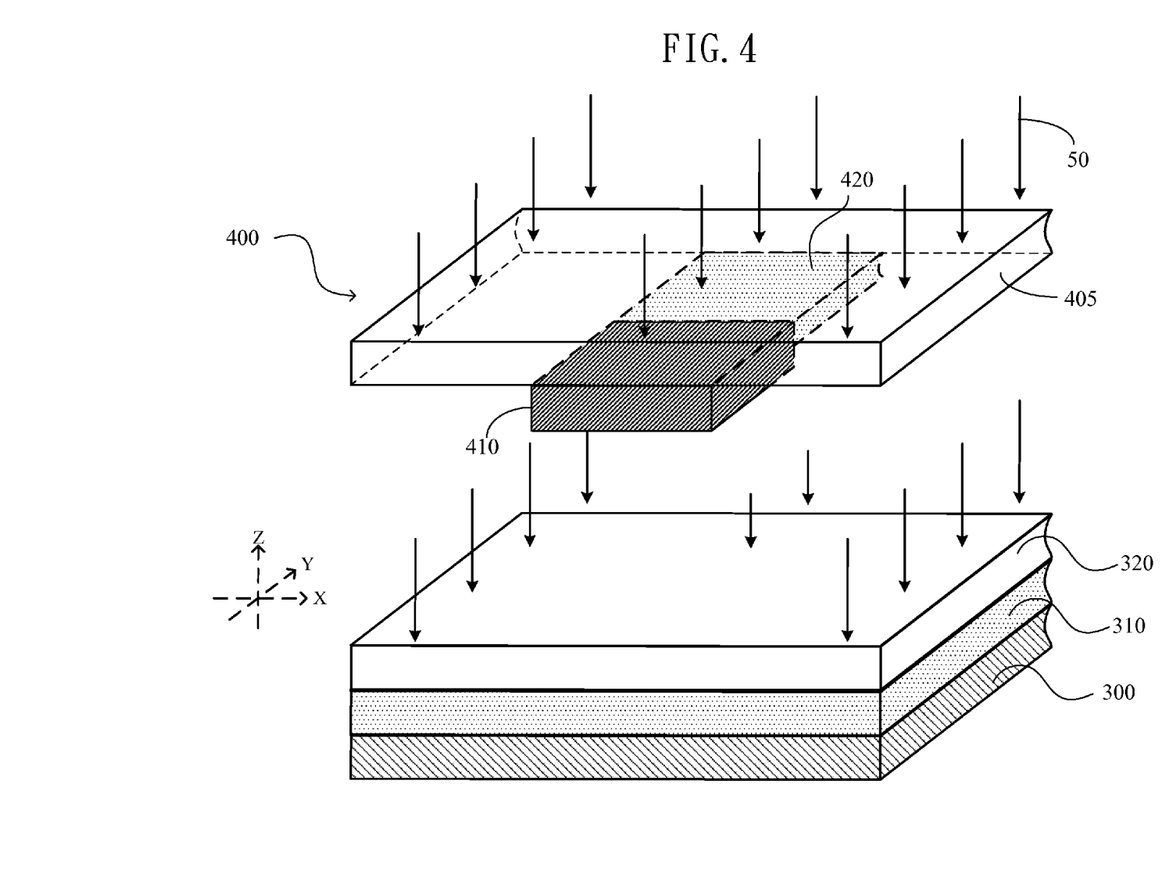
FIG. 4 is a side view illustrating the exposure of using a grayscale mask.

FIG. 4 is a side view illustrating the exposure of using a grayscale mask. After forming the metal layer 310 and the photoresist layer 320 on the substrate 300, a grayscale mask 400 is utilized to pattern the photoresist layer 320. The methods of patterning a photoresist layer include exposure, developing, etching, soft-baked, hard-baked, etc., with which the person having ordinary skill in the art is familiar. For a clearer explanation, a single pattern of the grayscale mask utilized to form only a single metal bump of the probe and a metal wire connected with the single metal bump is to be described as an exemplary explanation. As shown in FIG. 4, the grayscale mask 400 includes a transparent substrate 405, an opaque bump region 410, and a translucent lead region 420 (extended to the Y-axis).

The shapes or sizes of the area of the opaque bump region 410 are designed in accordance with the test pads, and the opaque bump region 410 is disposed at the bottom of the transparent substrate 405. The material of the opaque bump region 410 is an opaque metal that can completely block the light 50 being radiated from an exposure machine or a writer (not shown), so that the corresponding photoresist layer 320 which is below the opaque bump region 410 is not exposed by the light 50. The translucent lead region 420 is a half-tone mask which is adjacent to the opaque bump region 410 and is disposed at the bottom of the transparent substrate 405. The translucent lead region 420 is utilized to block a portion of the light 50, so that the corresponding photoresist layer 320 which is below the translucent lead region 420 is partly exposed by the light 50. The region of the transparent substrate 405 which is uncovered by the opaque bump region 410 or the translucent lead region 420 does not have the ability to block the light 50, so that the corresponding photoresist layer 320 which is below the region of the transparent substrate 405 is fully exposed by the light 50. Incidentally, the arrows in FIG. 4 indicate the strength of the light 50.

Figure 5:
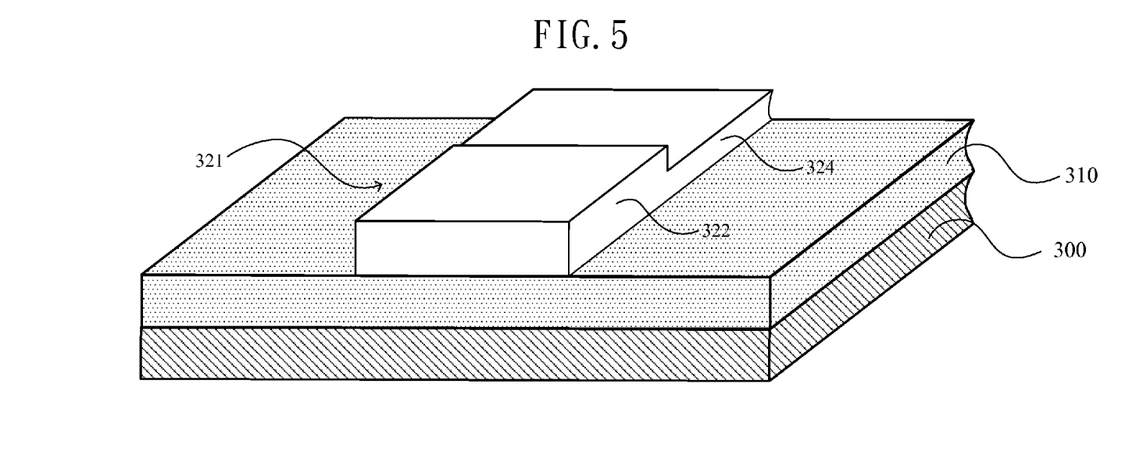
FIG. 5 is a side view illustrating the photoresist layer after the developing step.

After the aforementioned step, when the positive type photoresist layer 320 is exposed, a developing step to form a patterned circuit protection layer 321 is proceeded. FIG. 5 is a side view illustrating the photoresist layer after the developing step. As shown in FIG. 5, the region of the positive type photoresist layer 320 which is corresponding to the opaque bump region 410 is unexposed. A bump area 322 which is corresponding to the opaque bump region 410 is remained after the developing step, and the thickness of the bump area 322 is equal to the photoresist layer 320 which is formed firstly. The region of the positive type photoresist layer 320 which is corresponding to the translucent lead region 420 is partly exposed. A lead area 324 which is corresponding to the translucent lead region 420 is remained after the developing step, and the thickness of the bump area 322 is smaller than the photoresist layer 320 which is formed firstly. The remaining region of the photoresist layer 320 which is fully exposed is completely washed off after the developing step and the metal layer 310 is uncovered.

Figure 6:
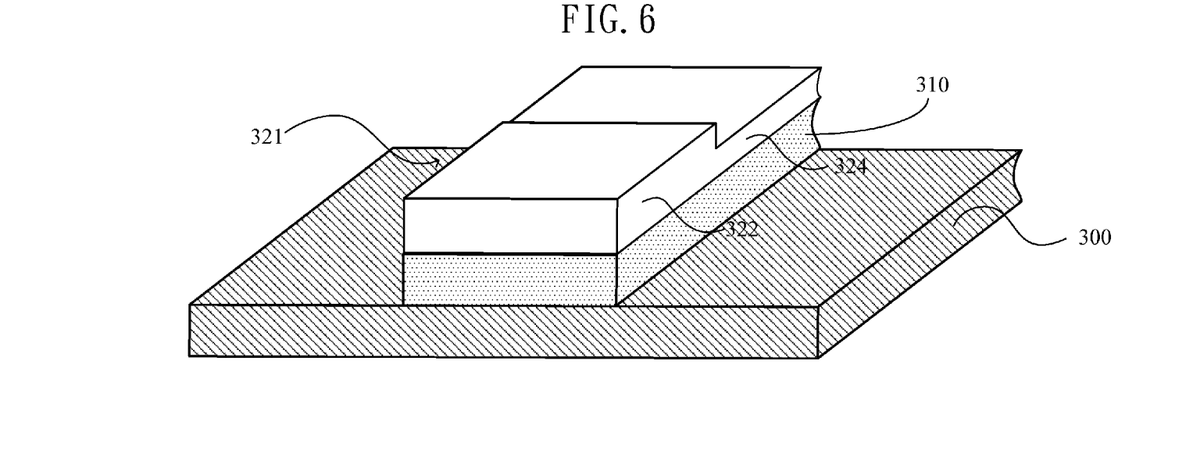
FIG. 6 is a side view illustrating the uncovered metal layer that is etched.

Finally, the etching steps are proceeded. The etching steps include a line etching step, a photoresist etching step, and a step forming a metal wire. Briefly, the etching steps are utilized to etch the patterned circuit protection layer 321 and the metal layer 310 to form the probe. FIG. 6 is a side view illustrating the uncovered metal layer being etched. As shown in FIG. 6, after the developing step, the line etching step is proceeded. The line etching step includes a wet chemical etching or a physical etching, one preferred embodiment of the present invention utilizes a wet chemical etching The line etching step herein utilizes a metal etchant to etch away the metal layer 310 which is uncovered by the patterned circuit protection layer 321 for exposing the substrate 300. The characteristic of the metal etchant is that the metal etchant only reacts with the material of the metal layer 310, whereas not to react with the patterned circuit protection layer 321 of the positive type photoresist.

Figure 7:
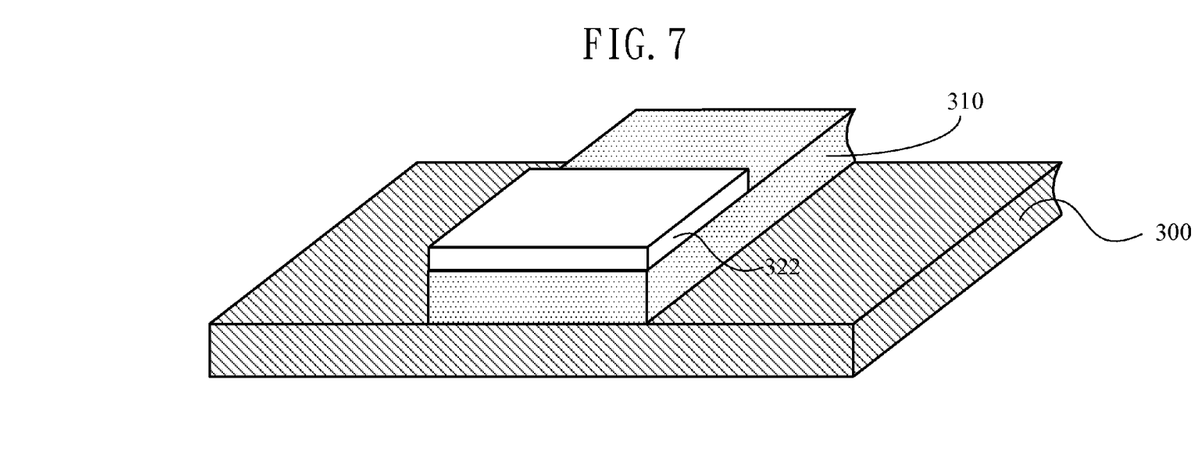
FIG. 7 is a side view illustrating the lead area of the patterned circuit protection layer that is etched.

FIG. 7 is a side view illustrating the lead area of the patterned circuit protection layer being etched. As shown in FIG. 7, in the photoresist etching step, the lead area 324 of the patterned circuit protection layer 321 is etched for exposing the metal layer 310 in the lead area 324. When the photoresist etching step is proceeding, the bump area 322 of the patterned circuit protection layer 321 is also etched. However, due to the thickness of the bump area 322 greater than the thickness of the lead area 324, a certain thickness of the patterned circuit protection layer 321 in the bump area 322 is remained after the lead area 324 is etched away. The photoresist etching step utilizes wet chemical etching or physical etching, and the characteristic of the photoresist etching step is only to etch the material of photoresist layer 320, whereas not to etch the metal layer 310 or the substrate 300.

Figure 8:
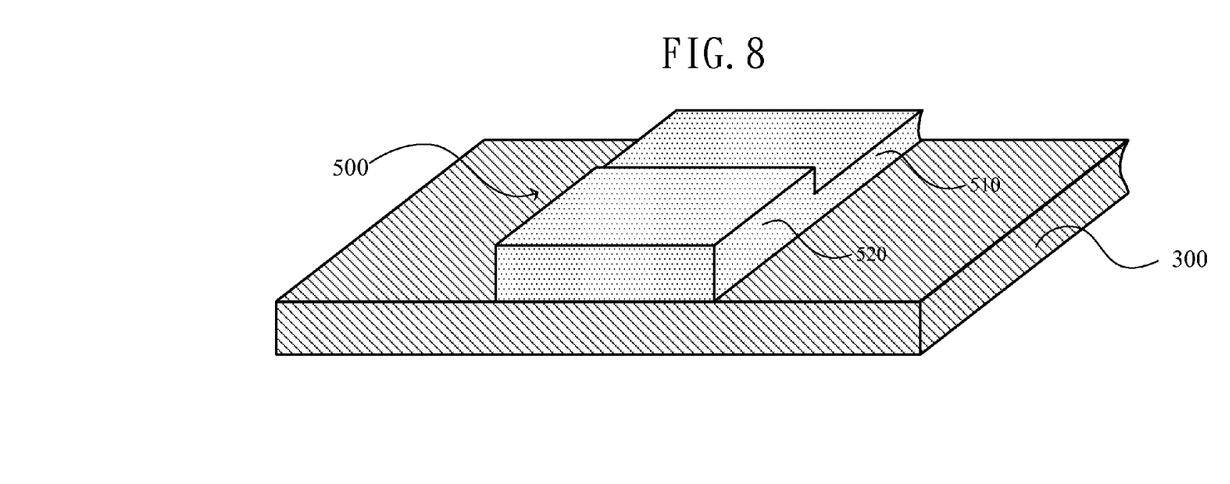
FIG. 8 is a side view illustrating the probe in accordance with one preferred embodiment of the present invention.

FIG. 8 is a side view illustrating the probe in accordance with one preferred embodiment of the present invention. FIG. 8 illustrates the metal bump and the metal wire formed after the etching steps. After etching away the lead area 324 of the photoresist layer 320, the uncovered metal layer 310 is etched to form a metal wire 510. Similarly, in one preferred embodiment of the present invention, a metal etchant is utilized to etch part of the thickness (e.g. 80 μm) of the metal layer 310 uncovered by the bump area 322 to form the metal wire 510, which is thinner than the original metal layer 310.

After the etching steps of the metal layer to form the metal wire, the method further includes stripping the patterned circuit protection layer 321 in the bump area 322. The method utilizes a photoresist stripper to remove the bump area 322 of photoresist layer for exposing the metal bump 520, which is thicker than the metal wire 510. The metal wire 510 and the metal bump 520 herein are to form a probe 500 in accordance with one preferred embodiment of the present invention.

Accordingly, the probe fabrication method of the present invention utilizes the grayscale mask 400 with only one mask manufacturing process, and the production costs are significantly reduced compared with conventional art that requires two mask manufacturing processes. In addition, the metal bumps 520 and the metal wires 510 are formed by partitioning the regions of the metal bumps 520 and the metal wires 510 in the same metal layer 310 at the line etching step, and by etching the metal layer 310 according to the bump area 322 and the lead area 324 into two different sizes of thickness. The issue of the bump being dislocated in the conventional art, which requires two mask manufacturing processes, will be improved.

To achieve another object of the present invention, a probe block fabricated by the aforementioned probe fabrication method is provided. Please refer to FIG. 8 and FIG. 9. FIG. 8 is a side view illustrating the probe in accordance with one preferred embodiment of the present invention as mentioned above, and FIG. 9 is a cross-sectional view illustrating the probe block contacting the test pads in accordance with one preferred embodiment of the present invention. The probe block 100 includes a substrate 300, a plurality of metal wires 110, and a plurality of metal bumps 120.

Figure 9:
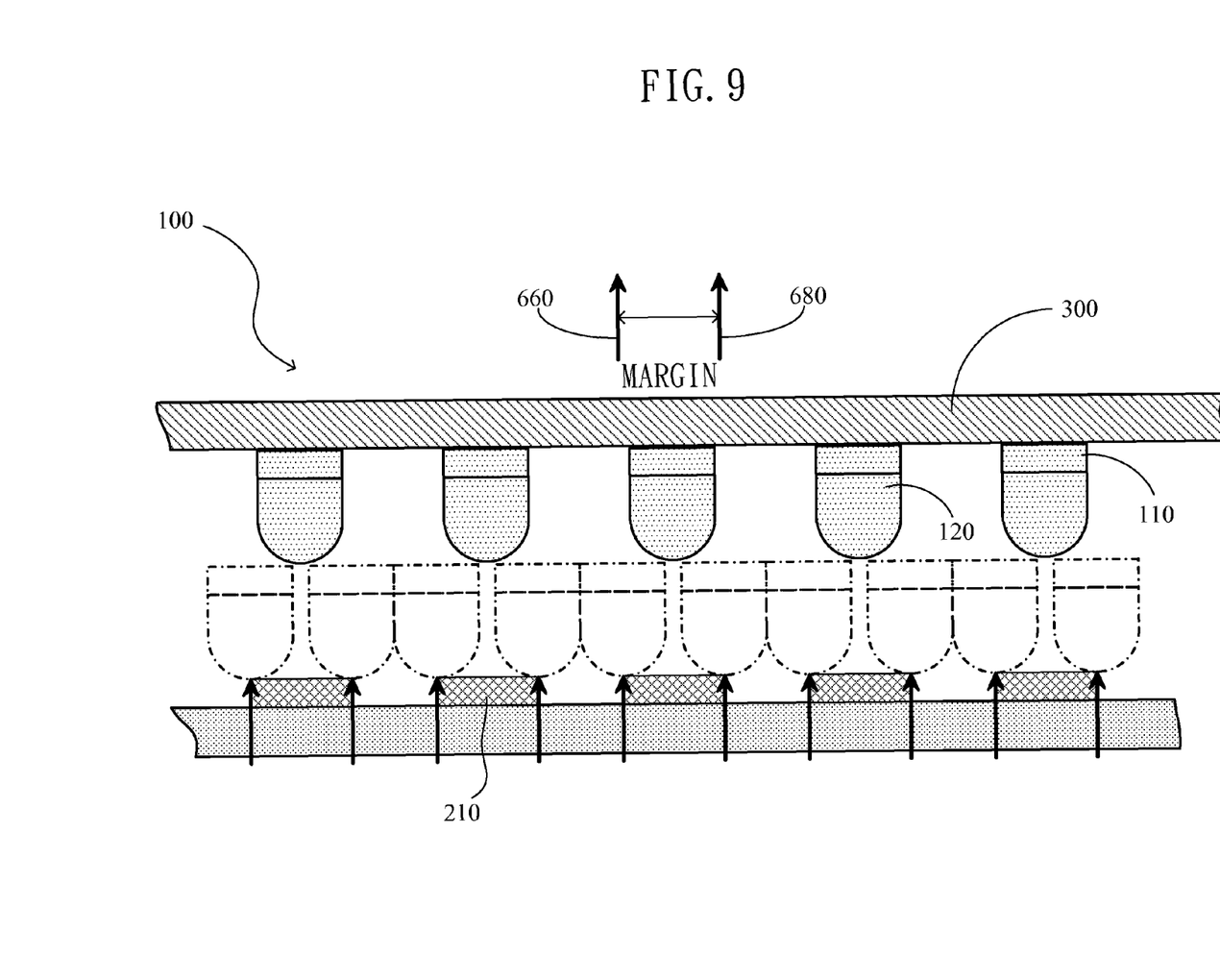
FIG. 9 is a cross-sectional view illustrating the probe block contacting the test pads in accordance with one preferred embodiment of the present invention.

The metal wires 110 are disposed on the substrate 300, and each metal wire 110 is the same as the metal wire 510 which is shown in FIG. 8. Each metal bump 120 is disposed over the end of each metal wire 110, and each one of the metal bumps 120 and the corresponding metal wire are formed jointlessly, that is, there are no gaps or dislocated distances therebetween, such as the metal bump 520 and the metal wire 510 shown in FIG. 8. The fabrication method is the same as aforementioned. It should be noted that, although the contact surfaces of the metal bumps 120, which contact the test pads 210, are convex surfaces and the contact surfaces of the metal bumps 520 are flat surfaces, the convex surfaces of the metal bumps 120 can be formed from the metal bumps 520 in another process, for example, another metal etching process, or other micro-machining processes. Incidentally, the substrate 300 is a flexible printed circuit board.

In accordance with the probe block 100 of the present invention, the distances between the adjacent metal bumps are the same. That is, the probes are fabricated by the grayscale mask in accordance with one preferred embodiment of the present invention, and there is no issue involving dislocated distances as in conventional art that require two mask manufacturing processes.

Accordingly, when the probe block 100 of the present invention is utilized to test a liquid crystal display panel, the distance between the left limit 660 and the right limit 680 is increased due to the distances between the adjacent metal bumps 120 are the same, which can correctly test by contacting the test pads 210, as shown by dashed lines in FIG. 9. Furthermore, the margin of contact between the probe block 100 and the test pads 210 is also increased. That is, the issue of the narrow margin that the metal bumps and the metal wires of the probe block can not be precisely aligned in conventional art is solved.

To summarize, since the metal bumps 120 and the metal wires 110 are fabricated in the same grayscale mask manufacturing process, the metal bump 120 in the single probe of the present invention must be formed on the top of the metal wire 110 without any dislocation. The issue that the metal bumps may be cracked causing by using two mask manufacturing processes is also solved, thereby extending the service life of the probe. Moreover, the issue of the inaccurate testing is also solved.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A probe fabrication method comprising:
    forming a metal layer on a substrate;
    forming a photoresist layer on the metal layer;
    patterning the photoresist layer by using a grayscale mask to form a patterned circuit protection layer, the patterned circuit protection layer having a bump area and a lead area, and the bump area being thicker than the lead area, wherein the grayscale mask comprises an opaque bump region and a translucent lead region; and
    etching the patterned circuit protection layer and the metal layer so that the metal layer is formed as a probe corresponding to the patterned circuit protection layer, wherein the metal layer is etched as a metal bump and a metal wire of the probe, the metal bump corresponding to the bump area and the metal wire corresponding to the lead area.

2. The probe fabrication method of claim 1, wherein the photoresist layer is a positive type photoresist layer.

3. The probe fabrication method of claim 1, wherein the translucent lead region is a half-tone mask.

4. The probe fabrication method of claim 1, wherein the material of the opaque bump region is an opaque metal.

5. The probe fabrication method of claim 1, wherein the steps of etching the patterned circuit protection layer and the metal layer include:
    etching the metal layer which is uncovered by the patterned circuit protection layer;
    etching the patterned circuit protection layer for exposing the metal layer in the lead area, and remaining the patterned circuit protection layer in the bump area; and
    etching the metal layer corresponding to the lead area for a thickness that the etched metal layer is thinner than the metal bump in forming the metal wire.

6. The probe fabrication method of claim 5, wherein after the steps of etching the metal layer to form the metal wire, further include stripping the patterned circuit protection layer in the bump area to expose the metal bump.

7. A probe block fabricated by the probe fabrication method of claim 1, the probe block comprising:
    a plurality of metal wires disposed on a substrate; and
    a plurality of metal bumps, wherein each metal bump is disposed over an end of each metal wire, and each one of the metal bumps and the corresponding metal wire are formed jointlessly.

8. The probe block of claim 7, wherein the distances between the adjacent metal bumps are the same.

9. The probe block of claim 7, wherein the substrate is a flexible printed circuit board.

10. A probe fabrication method comprising:
    forming a metal layer on a substrate;
    forming a photoresist layer on the metal layer;
    patterning the photoresist layer by using a grayscale mask to form a patterned circuit protection layer, the patterned circuit protection layer having a bump area and a lead area, and the bump area being thicker than the lead area; and
    etching the patterned circuit protection layer and the metal layer so that the metal layer is formed as a probe corresponding to the patterned circuit protection layer, wherein the metal layer is etched as a metal bump and a metal wire of the probe, the metal bump corresponding to the bump area and the metal wire corresponding to the lead area;
    wherein the steps of etching the patterned circuit protection layer and the metal layer include:
    etching the metal layer which is uncovered by the patterned circuit protection layer;
    etching the patterned circuit protection layer for exposing the metal layer in the lead area, and remaining the patterned circuit protection layer in the bump area; and
    etching the metal layer corresponding to the lead area for a thickness that the etched metal layer is thinner than the metal bump in forming the metal wire.

11. A probe block fabricated by a probe fabrication method, the method comprising:
    forming a metal layer on a substrate;
    forming a photoresist layer on the metal layer;
    patterning the photoresist layer by using a grayscale mask to form a patterned circuit protection layer, the patterned circuit protection layer having a bump area and a lead area, and the bump area being thicker than the lead area; and
    etching the patterned circuit protection layer and the metal layer so that the metal layer is formed as a probe corresponding to the patterned circuit protection layer, wherein the metal layer is etched as a metal bump and a metal wire of the probe, the metal bump corresponding to the bump area and the metal wire corresponding to the lead area;
    the probe block further comprising:
    a plurality of metal wires disposed on a substrate; and
    a plurality of metal bumps, wherein each metal bump is disposed over an end of each metal wire, and each one of the metal bumps and the corresponding metal wire are formed jointlessly.

* * * * *